United States Patent
Okumura et al.

(10) Patent No.: US 11,456,396 B2
(45) Date of Patent: Sep. 27, 2022

(54) PHOTOELECTRIC CONVERSION DEVICE FOR SOLAR PHOTOVOLTAIC GENERATION

(71) Applicant: TOYOTA JIDOSHA KABUSHIKI KAISHA, Toyota (JP)

(72) Inventors: Kenichi Okumura, Gotemba (JP); Taizo Masuda, Yokohama (JP); Ryota Tomizawa, Mishima (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/399,491

(22) Filed: Aug. 11, 2021

(65) Prior Publication Data
US 2022/0115550 A1 Apr. 14, 2022

(30) Foreign Application Priority Data
Oct. 8, 2020 (JP) .............................. JP2020-170813

(51) Int. Cl.
*H01L 31/055* (2014.01)
*H01L 31/054* (2014.01)
*H01L 31/046* (2014.01)

(52) U.S. Cl.
CPC .......... *H01L 31/055* (2013.01); *H01L 31/046* (2014.12); *H01L 31/0543* (2014.12); *H01L 31/0547* (2014.12)

(58) Field of Classification Search
CPC .............. H01L 31/054; H01L 31/0543; H01L 31/0547; H01L 31/055
See application file for complete search history.

(56) References Cited

U.S. PATENT DOCUMENTS

| 6,127,620 A | * | 10/2000 | Tange | ..................... F24S 50/20 136/246 |
| 2011/0226332 A1 | * | 9/2011 | Ford | ................... G02B 6/0038 257/E31.127 |

(Continued)

FOREIGN PATENT DOCUMENTS

| JP | S58-049860 A | | 3/1983 | |
| JP | 2003101059 A | * | 4/2003 | ......... H01L 31/0543 |

(Continued)

OTHER PUBLICATIONS

Masuda, T. et al., "Static concentrator photovoltaics for automotive applications," Solar Energy, vol. 146, 2017, pp. 523-531.

*Primary Examiner* — Golam Mowla
(74) *Attorney, Agent, or Firm* — Oliff PLC

(57) ABSTRACT

A photoelectric conversion device includes: a fluorescent light guide plate that has a plate-shaped structure in which fluorescent substances that absorb sunlight and emit fluorescent light are dispersed and which is formed of a material having a refractive index different from a refractive index of an outside, the fluorescent light emitted from the fluorescent substances being concentrated onto an edge surface to be emitted when the sunlight is incident; a first photoelectric cell configured to generate power by being irradiated with the sunlight; a lens layer configured such that light incident from an outer surface is concentrated onto the first photoelectric cell; a second photoelectric cell configured to generate power by being irradiated with the fluorescent light emitted from the edge surface of the fluorescent light guide plate; and power output units configured to extract power obtained in the photoelectric cells.

10 Claims, 4 Drawing Sheets

(56) References Cited

U.S. PATENT DOCUMENTS

| | | | | |
|---|---|---|---|---|
| 2011/0253197 | A1* | 10/2011 | Mapel | H01L 31/055 359/884 |
| 2012/0024345 | A1* | 2/2012 | Reisfeld | H01L 31/0547 136/247 |
| 2012/0118381 | A1* | 5/2012 | Debije | H01L 31/054 362/621 |
| 2013/0247960 | A1* | 9/2013 | Morgan | H01L 31/0547 136/246 |
| 2015/0083193 | A1 | 3/2015 | Ueda | |
| 2019/0067505 | A1* | 2/2019 | Ko | H01L 31/043 |
| 2019/0109248 | A1* | 4/2019 | Banerjee | H01L 31/0547 |

FOREIGN PATENT DOCUMENTS

| | | | | |
|---|---|---|---|---|
| JP | 2014-010251 A | | 1/2014 | |
| JP | 2018082143 A | * | 5/2018 | G02B 3/0056 |
| JP | 2020-513159 A | | 4/2020 | |
| WO | WO-2006085397 A1 | * | 8/2006 | G04C 10/02 |
| WO | WO-2011012545 A1 | * | 2/2011 | G02B 6/004 |
| WO | WO-2011158956 A1 | * | 12/2011 | F24J 2/1047 |
| WO | 2018/186712 A1 | | 10/2018 | |

* cited by examiner

PHOTOELECTRIC CONVERSION DEVICE FOR SOLAR PHOTOVOLTAIC GENERATION

CROSS-REFERENCE TO RELATED APPLICATION

This application claims priority to Japanese Patent Application No. 2020-170813 filed on Oct. 8, 2020, incorporated herein by reference in its entirety.

BACKGROUND

1. Technical Field

The present disclosure relates to a photoelectric conversion device in which a photoelectric cell is supported on a substrate, and more specifically, relates to a photoelectric conversion device configured to concentrate sunlight and irradiate a photoelectric cell with the concentrated sunlight.

2. Description of Related Art

In order to reduce a cost or dimensions of a solar photovoltaic generation system by increasing the amount of power generation per photoelectric cell (examples thereof include solar cell) in the system or decreasing the number of photoelectric cells to be used while improving the power generation efficiency in the system, various configurations of a solar cell module or a photoelectric conversion device for concentration of sunlight of which an intensity is originally low and irradiation of a photoelectric cell with the concentrated sunlight have been proposed. For example, in Japanese Unexamined Patent Application Publication No. 2014-010251 (JP 2014-010251 A), providing a secondary lens between a condenser lens and a solar cell in a light concentration type solar photovoltaic generation device that is configured such that the condenser lens is disposed on a light receiving surface side of the solar cell and concentrates sunlight has been proposed, the secondary lens being shaped like a flat surface and being configured to efficiently concentrate sunlight onto the light receiving surface of the solar cell and suppress excessive concentration of light. In Japanese Unexamined Patent Application Publication No. 2020-513159 (JP 2020-513159 A), a configuration in which a front substrate is disposed to be separated from a sunlight incidence surface of a solar cell disposed on a substrate (rear substrate) and light is confined by being reflected on each substrate between the front substrate and the rear substrate so that the amount of light with which a light receiving surface of the solar cell is irradiated is increased and a configuration in which a lens that concentrates sunlight and irradiates a solar cell with the concentrated sunlight is formed on a front substrate have been proposed. In Japanese Unexamined Patent Application Publication No. 58-049860 (JP 58-049860 A), a configuration has been proposed in which a structure, in which a solar cell is in close contact with an edge of a glass or acrylic resin light-transmitting substrate that contains a fluorescent substance, is formed, a part of wavelength components of sunlight entering the light-transmitting substrate is totally reflected at a surface of the light-transmitting substrate as it is and is concentrated onto the edge of the light-transmitting substrate, another part of the wavelength components is absorbed by the fluorescent substance, becomes fluorescent light emitted from the fluorescent substance, is totally reflected at the surface of the light-transmitting substrate, and is concentrated onto the edge of the light-transmitting substrate, and the solar cell is irradiated with the fluorescent light. Furthermore, in Static concentrator photovoltaics for automotive applications (T. Masuda et. al., Solar Energy 146 (2017) 523-531) written by some of the present inventors, adopting an asymmetric-aspherical lens configured to be able to concentrate sunlight at a high efficiency throughout the year as a lens for concentration of sunlight, with which a photoelectric cell is irradiated, has been proposed considering that scattered light components of sunlight scattered at a cloud, a building, or the like are also concentrated by a lens in addition to direct light components that directly reach the lens from the sun in a case where a solar cell module is installed on a moving object, such as a vehicle.

SUMMARY

In the case of a configuration in which sunlight is concentrated by a lens in a photoelectric conversion device, such as a solar cell module, in which sunlight is concentrated and a photoelectric cell is irradiated with the concentrated sunlight as described above (for example, JP 2014-010251 A and JP 2020-513159 A), the position or range of irradiation performed by light concentrated by the lens changes when the angle of incidence of the sunlight with respect to the lens is changed. Therefore, in order to make sunlight reaching the device hit the photoelectric cell with as little loss as possible, a sun-tracking mechanism that changes the orientations of the lens and the photoelectric cell at a high precision in accordance with a change in orientation of the sunlight needs to be provided (as will be described later in embodiment, in case where orientations of lens and cell are fixed, amount of light with which photoelectric cell is irradiated is decreased when angle of incidence (angle between direction in which sunlight is incident and optical axis of lens) of sunlight with respect to lens is increased and solar cell is not irradiated with light when angle of incidence exceeds certain angle (FIG. 5)). However, in a case where the sun-tracking mechanism that causes the orientations of the lens and the cell to follow the orientation of the sunlight at a high precision is provided, there is a probability that a configuration is made large, the size of the device is made large, and the cost increases. Therefore, it is advantageous that sunlight energy can be converted into power as much as possible without a high-precision sun-tracking mechanism or without a sun-tracking mechanism itself (Static concentrator photovoltaics for automotive applications (T. Masuda et. al., Solar Energy 146 (2017) 523-531) indicates that it is possible to concentrate, onto photoelectric cell, light incident at certain range of angles (within approximately 60 degrees) without using sun-tracking mechanism when an asymmetric-aspherical lens is used but it is difficult to cause light, of which angle of incidence is larger, to reach photoelectric cell). Meanwhile, in the case of a configuration in which fluorescent light that is converted from sunlight by fluorescent substances is concentrated to an edge of a light-transmitting substrate (hereinafter, will be referred to as "fluorescent light guide plate") in which the fluorescent substances are dispersed (for example, JP 58-049860 A), it is possible to concentrate light to a photoelectric cell at an edge surface of the substrate without using a sun-tracking mechanism. However, since energy applied to the photoelectric cell is fluorescent light energy obtained when sunlight energy is converted by the fluorescent substances, energy loss may occur in a conversion step thereof depending on the quantum yield of the fluorescent substances or a difference between an absorption wavelength and a light emission wavelength of light. Therefore, in the viewpoint of increasing sunlight energy use efficiency, it is preferable that sunlight is absorbed by the photoelectric cell as it is without undergoing a step of being converted into fluorescent light as far as possible.

The present disclosure provides a configuration of a photoelectric conversion device configured such that sunlight (or sunlight energy) is concentrated and a photoelectric cell is irradiated with the concentrated sunlight and solar photovoltaic generation is performed at the photoelectric cell, with which it is possible to improve sunlight energy use efficiency even when a high-precision sun-tracking mechanism is not used or to reduce energy loss occurring when power is obtained from sunlight as much as possible.

A first aspect of the disclosure relates to a photoelectric conversion device including a fluorescent light guide plate, a first photoelectric cell, a lens layer, a second photoelectric cell, and power output units. The fluorescent light guide plate includes a first surface, a second surface, and an edge surface that connects peripheral edges of the first surface and the second surface to each other and has a plate-shaped structure in which fluorescent substances that absorb at least a portion of components of sunlight and emit fluorescent light are dispersed in the fluorescent light guide plate or on the first surface or the second surface and which is formed of a material having a refractive index different from a refractive index of an outside, the fluorescent light guide plate being configured such that the fluorescent light emitted from the fluorescent substances are concentrated onto the edge surface to be emitted when the sunlight is incident from the first surface. The first photoelectric cell is configured to generate power by being irradiated with the sunlight, the first photoelectric cell being mounted on the first surface of the fluorescent light guide plate. The lens layer is configured such that light incident from an outer surface that is on a side opposite to a surface facing the first surface of the fluorescent light guide plate is concentrated onto the first photoelectric cell, the lens layer overlapping the first surface and the first photoelectric cell. The second photoelectric cell is configured to generate power by being irradiated with the fluorescent light emitted from the edge surface, the second photoelectric cell being mounted on the edge surface of the fluorescent light guide plate. The power output units is configured to extract power obtained in each of the first photoelectric cell and the second photoelectric cell.

In the above-described configuration, the "fluorescent light guide plate" is a plate-shaped member configured such that the fluorescent substances dispersed in the fluorescent light guide plate or on the first surface or the second surface are excited and emit the fluorescent light and the fluorescent light is guided to an edge surface of the plate-shaped structure to be concentrated and emitted when light is incident from a wide surface (first surface) of the plate-shaped structure. The fluorescent light emitted from the fluorescent substances is emitted in radial directions. When the refractive index of the fluorescent light guide plate having the plate-shaped structure is different from the refractive index of the outside, a portion of the fluorescent light is transmitted through interfaces between wide surfaces (first surface or second surface) of the plate-shaped structure and the outside but the remainder of the fluorescent light is reflected (considerable amount of fluorescent light is reflected due to total reflection when refractive index of fluorescent light guide plate is higher than refractive index of outside) and thus is concentrated onto the edge surface of the plate-shaped structure to be emitted therefrom. The "fluorescent substances" dispersed in a material forming the fluorescent light guide plate may be any substance, such as a fluorescent dye or a quantum dot which absorbs excitation light and emits fluorescent light when the substance is irradiated with the excitation light. Note that, for example, a configuration in which the fluorescent substances are dispersed on the first surface or the second surface may be achieved by sticking or forming a thin film, in which the fluorescent substances are dispersed, on the first surface or the second surface in an embodiment.

The "first photoelectric cell" is any type of photoelectric cell or photoelectric conversion element that absorbs light components included in the sunlight to generate power. As the first photoelectric cell, preferably, it is advantageous that a III-V multijunction solar cell having excellent power generation efficiency is used as the first photoelectric cell. However, the first photoelectric cell may be any other type of solar cell, such as a CIS solar cell, a crystalline silicon solar cell, an amorphous silicon solar cell, and a perovskite solar cell.

As described above, the "lens layer" is a light-transmitting layer overlapping the first surface of the fluorescent light guide plate and the first photoelectric cell and is a layer on which a lens portion is formed, the lens portion being configured to concentrate light incident from the outer surface thereof (surface that is on side opposite to surface facing first surface of fluorescent light guide plate) onto the first photoelectric cell interposed between the first surface of the fluorescent light guide plate and the lens layer. The lens portion formed on the lens layer may have any shape as long as incident light can be concentrated and may be any of a spherical lens, an aspherical lens, and an asymmetric-aspherical lens.

The "second photoelectric cell" is any type of photoelectric cell or photoelectric conversion element that absorbs fluorescent light components emitted from the fluorescent substances in the fluorescent light guide plate to generate power. Note that, the second photoelectric cell may be an element that absorbs light components included in the sunlight as well to generate power. Note that, the second photoelectric cell may be a solar cell, such as a CIS solar cell, a crystalline silicon solar cell, an amorphous silicon solar cell, and a perovskite solar cell.

In the above-described configuration of the device of the present disclosure, as will be understood from the accompanying drawings which will described in detail later, when sunlight is incident from the outer surface of the lens layer of the device, the first photoelectric cell is irradiated with as many components as possible of the sunlight due to the light concentration action of the lens portion of the lens layer and the components are converted into power at the first photoelectric cell. Meanwhile, components of the sunlight that miss the lens portion or components of the sunlight that do not hit the first photoelectric cell since the angle of incidence is large enter the fluorescent light guide plate, are absorbed by the fluorescent substances in the fluorescent light guide plate, emitted in the form of fluorescent light, and concentrated onto the edge surface of the fluorescent light guide plate. Then, the second photoelectric cell is irradiated with the components and the components are converted into power at the second photoelectric cell. In the case of the configuration as described above, first, in the first photoelectric cell, the sunlight incident onto the lens layer and concentrated is absorbed as it is to be converted into power and thus high-efficiency photoelectric conversion is achieved. Therefore, it is expected that power generation in which sunlight energy loss is suppressed as much as possible is performed when the first photoelectric cell is irradiated with as many sunlight components as possible. However, the first photoelectric cell is not irradiated with components of the sunlight that miss the lens portion or components of the sunlight of which the angle of incidence with respect to the lens portion is large and it is difficult to irradiate, by means of the light concentration action of the lens layer, the first photoelectric cell with all of the sunlight with which the lens layer is irradiated. Therefore, in the device of the present disclosure, a structure in which the above-described fluorescent light guide plate is adopted as a substrate for the first photoelectric cell, the second photoelectric cell is disposed on the edge surface of the fluorescent light guide plate, sunlight components that are incident onto the lens layer but do not hit the first photoelectric cell are guided into the fluorescent light guide plate, and the energy thereof can be collected by the second photoelectric cell and can be used for power generation is configured. Accordingly, it is possible to collect a larger amount of sunlight energy as power in the device. In other words, in the device of the present disclosure, photoelectric conversion can be achieved at a higher efficiency with the configurations of the lens layer and the first photoelectric cell and with the configurations of the fluorescent light guide plate and the second photoelectric cell, sunlight energy can be collected as power even when the angle of incidence of the sunlight with respect to the lens layer is changed variously and thus the robustness (performance of suppressing decrease in power generation efficiency caused by change in angle of incidence of sunlight) as a photoelectric conversion device is improved.

In the above configuration, the energy conversion efficiency is highest in a case where sunlight is absorbed by the first photoelectric cell as it is and converted into power. Therefore, it is preferable that the lens layer can concentrate as many components as possible of incident light onto the first photoelectric cell. Specifically, the shape of the lens portion of the lens layer and the disposition of the first photoelectric cell with respect to the lens portion may be adjusted such that the maximum value of a ratio (hereinafter, will be referred to as "light concentration ratio") of the area of a surface (incidence surface) of the lens portion onto which light to be concentrated is incident to the area of a region irradiated with light concentrated by the lens portion above the first photoelectric cell is two or more, preferably, four or more. Furthermore, it is preferable that a light receiving surface of the first photoelectric cell is irradiated with as many components as possible of light concentrated by the lens layer. Therefore, the lens layer may be configured such that the light receiving surface of the first photoelectric cell is irradiated with light concentrated by the lens layer when the angle of incidence of light incident onto the outer surface of the lens layer is lower than a predetermined angle. Typically, the lens layer may be configured such that the light receiving surface of the first photoelectric cell is irradiated with all of the light concentrated by the lens portion of the lens layer when light is incident in a direction perpendicular to the outer surface. However, the present disclosure is not limited thereto. In addition, the larger the ratio of a surface occupied by the lens portion to the entire surface of the lens layer on which the light is incident is, the more preferable it is. Typically, for example, the ratio may be 70% or more. In particular, as a geometrical configuration of the lens layer and the first photoelectric cell, a configuration in which an asymmetric-aspherical lens described in Static concentrator photovoltaics for automotive applications (T. Masuda et. al., Solar Energy 146 (2017) 523-531) is advantageously adopted (refer to FIG. 5). However, the present disclosure is not limited thereto.

In the above-described configuration of the device of the present disclosure, in a case where a plurality of the first photoelectric cells is mounted on a substrate (fluorescent light guide plate), it is favorable that the first photoelectric cells are disposed at portions to which the sunlight is concentrated since the sunlight incident on the lens layer is concentrated by the lens layer. Therefore, the plurality of first photoelectric cells may be arranged to be separated from each other on the first surface of the fluorescent light guide plate. In this case, sunlight that reaches a region on the first surface of the fluorescent light guide plate on which no first photoelectric cell is disposed is converted into fluorescent light and is supplied to the second photoelectric cell as described above after the sunlight enters the fluorescent light guide plate and even when some of light concentrated by the lens layer misses the first photoelectric cell, the some of light is collected as power via the fluorescent light guide plate. Accordingly, the first photoelectric cell does not need to be irradiated with all of the light concentrated by the lens layer in the strict sense. Therefore, it is expected that power can be obtained from the sunlight at a high efficiency even in a case where a high-precision sun-tracking mechanism or a sun-tracking mechanism itself is not provided.

In an embodiment of the device of the present disclosure, various configurations may be applied such that light entering the fluorescent light guide plate and fluorescent light emitted from the fluorescent light guide plate are confined in the fluorescent light guide plate as much as possible and are concentrated onto the edge surface of the fluorescent light guide plate. For example, when the refractive index of the fluorescent light guide plate is higher than the refractive index of the lens layer, light from the fluorescent light guide plate is confined in the fluorescent light guide plate due to total reflection at an interface between the lens layer and the fluorescent light guide plate. Therefore, each material may be selected such that the refractive index of the fluorescent light guide plate is higher than the refractive index of the lens layer. In addition, in a case where the lens layer and the fluorescent light guide plate are bonded to each other via an adhesive, each material may be selected such that the refractive index of a first adhesive layer bonding the fluorescent light guide plate and the lens layer to each other is lower than the refractive index of the fluorescent light guide plate and higher than the refractive index of the lens layer so that emission of light from the inside of the fluorescent light guide plate to the outside of the first surface is suppressed as much as possible. Note that, since light from the lens layer is not incident onto a portion of the first surface of the fluorescent light guide plate on which the first photoelectric cell is disposed, the refractive index of an adhesive layer at the portion may be lower than the refractive index of the lens layer and actually, the lower the refractive index of the portion is, the stronger the effect of confining the light in the fluorescent light guide plate is. Therefore, the materials may be selected such that the refractive index of a second adhesive layer bonding the fluorescent light guide plate and the first photoelectric cell is lower than the refractive index of the first adhesive layer. Note that, the second adhesive layer may be a cavity if possible. Furthermore, the second surface (opposite to first surface) of the fluorescent light guide plate may be covered with a reflection mirror layer that reflects light without allowing the light to be transmitted through the reflection mirror layer (in present specification, "not allowing light to be transmitted" means not allowing significant amount of sunlight or fluorescent light to be transmitted) such that light in the fluorescent light guide plate is not emitted from the second surface of the fluorescent light guide plate. Furthermore, in a case where there is a portion of the edge surface of the fluorescent light guide plate where the second photoelectric cell is not mounted, the portion may be covered with a reflection mirror layer that reflects light without allowing the light to be transmitted through the reflection mirror layer so that emission of light from the portion is prevented.

Depending on the type of the fluorescent substances in the fluorescent light guide plate of the above-described device of the present disclosure, significant re-absorption of fluorescent light may occur and thus energy loss may be made large. Therefore, the amount of fluorescent substances may be reduced for a region in the fluorescent light guide plate where the sunlight is not likely to reach like the vicinity of a portion where the first photoelectric cell is disposed so that re-absorption of fluorescent light is reduced. Therefore, in the device, the distribution of the fluorescent substances in the fluorescent light guide plate may be adjusted such that the density of the fluorescent substances in a region where light incident from the first surface does not reach is lower than the density of the fluorescent substances in a region where the light incident from the first surface reaches in the fluorescent light guide plate. Accordingly, the amount of re-absorption of the fluorescent light is reduced, the amount of unnecessary fluorescent substances is reduced, and the amount of use of the fluorescent substances can also be reduced.

Meanwhile, the device of the present disclosure is expected to improve photoelectric conversion efficiency robustness with respect to the angle of incidence of sunlight and thus is expected to be able to be applied onto objects having various shapes, such as a roof of a moving object. In this case, it is preferable that the device can be deformed to some extent in accordance with the shape of an object. Therefore, in the above-described device of the present disclosure, the fluorescent light guide plate and the lens layer may be formed of a flexible material.

Accordingly, according to the present disclosure described above, in the photoelectric conversion device in which sunlight is concentrated, the photoelectric cells are irradiated with the concentrated sunlight, and solar photovoltaic generation is performed at the photoelectric cells, a majority of light concentrated by the lens layer is absorbed by the first photoelectric cell and light that does not reach the first photoelectric cell is absorbed by the second photoelectric cell via the fluorescent light guide plate so that power generation is performed by means of photoelectric conversion for each light. Therefore, it is possible to improve power generation efficiency robustness with respect to the angle of incidence of sunlight. Therefore, it is expected that both of efficiency maximization and maintenance of robustness can be achieved when the efficiency of the first photoelectric cell, which absorbs the sunlight as it is to generate power, is maximized. Furthermore, according to the present disclosure, robustness against a change in angle of incidence of the sunlight at the lens portion of the photoelectric conversion device is improved and thus a range of allowable angles of incidence of sunlight at the lens portion is widened. Therefore, it is expected that a power generation efficiency requirement can be achieved in many cases without a sun-tracking mechanism and it is possible to advantageously reduce a tracking precision to be satisfied even in a case where a sun-tracking mechanism is used.

Other objects and advantages of the present disclosure will be made apparent from the following description of a preferred embodiment of the present disclosure.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Basic Configuration of Photoelectric Conversion Device

Figure 1A:
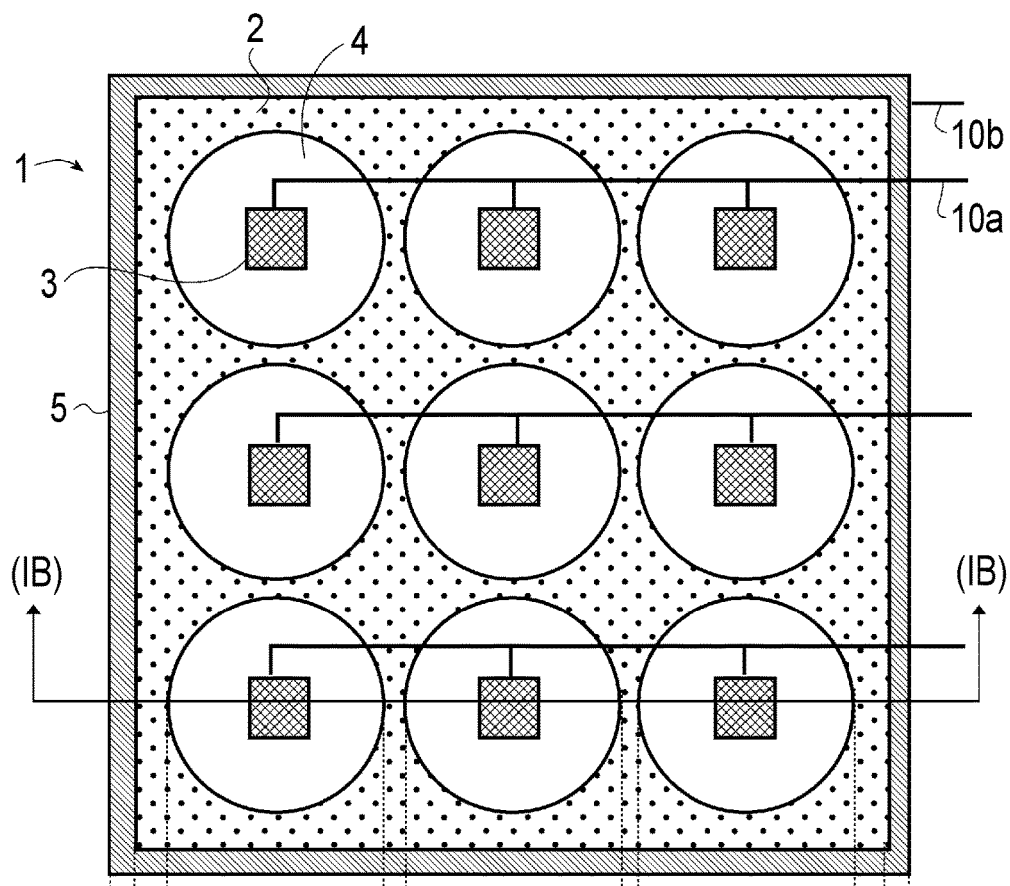
FIG. 1A is a schematic top view of an embodiment of a photoelectric conversion device according to the present disclosure.
Figure 1B:
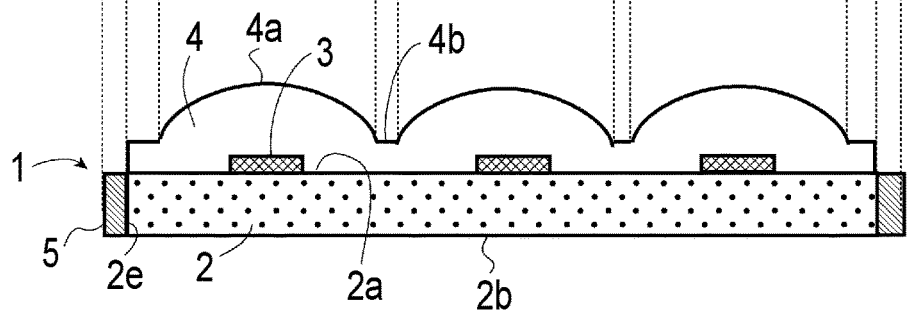
FIG. 1B is a schematic sectional view of the embodiment of the photoelectric conversion device according to the present disclosure and shows an example in which fluorescent substances are dispersed in a fluorescent light guide plate.

With reference to FIGS. 1A and 1B, the basic configuration of a photoelectric conversion device 1 of the present embodiment includes a fluorescent light guide plate 2 having a plate-shaped structure, photoelectric cells (first photoelectric cells) 3 mounted on a first surface (upper surface in drawings) 2a of the fluorescent light guide plate 2, a lens layer 4 overlapping the upper surface 2a of the fluorescent light guide plate 2 and the photoelectric cells 3, and a photoelectric cell (second photoelectric cell) 5 disposed on edge surfaces 2e of the fluorescent light guide plate 2. As shown in the drawings, power generated by the photoelectric cells 3 and 5 may be extracted through power lines 10a and 10b.

Figure 1C:
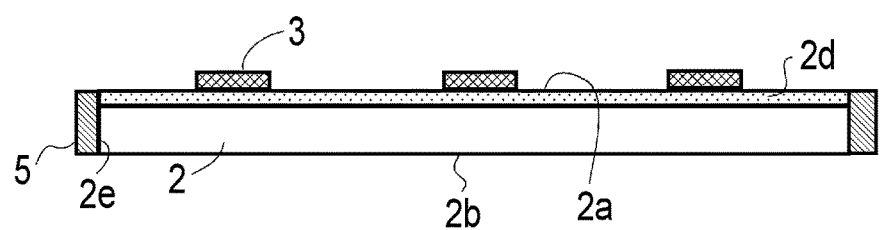
FIG. 1C is another embodiment of the fluorescent light guide plate of the photoelectric conversion device according to the present disclosure and shows an example in which the fluorescent substances are dispersed on an upper surface (first surface) of the fluorescent light guide plate.
Figure 1D:
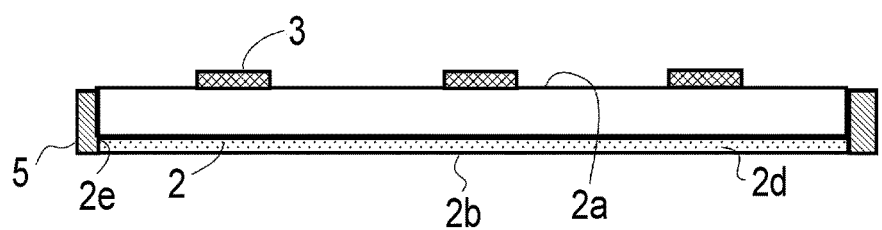
FIG. 1D is still another embodiment of the fluorescent light guide plate of the photoelectric conversion device according to the present disclosure and shows an example in which the fluorescent substances are dispersed on a lower surface (second surface) of the fluorescent light guide plate.

In the above-described photoelectric conversion device 1, as shown in the drawings, the fluorescent light guide plate 2 is used as a substrate on which the photoelectric cells 3 that absorb sunlight to generate power are disposed and is configured to have a function of receiving light with which the photoelectric cells 3 are not irradiated, converting the light into fluorescent light by means of fluorescent substances dispersed therein, and concentrating the fluorescent light to the edge surfaces. The base material of the fluorescent light guide plate 2 is a transparent or light-transmitting material having a refractive index higher than that of air and examples thereof include high-refractive-index poly methyl methacrylate resin (refractive index 1.60), polycarbonate resin (refractive index 1.59), polyester resin (refractive index 1.60), acrylic resin (1.49 to 1.53), silicon resin (1.43), and quartz glass (1.54 to 1.55). As will be described later, it is advantageous that the photoelectric conversion device 1 can be curved and deformed to such an extent that the photoelectric conversion device 1 can be applied to any object surface. Therefore, preferably, a flexible material may be selected as the base material of the fluorescent light guide plate 2. The fluorescent substances dispersed in the fluorescent light guide plate 2 may be any substance that absorbs sunlight and emits fluorescent light. With regard to this, since the wavelength band of sunlight is wide, it is preferable that the absorption wavelength band of the fluorescent substances is as wide as possible. Specifically, as the fluorescent substances, fluorescent dyes, such as Lumogen (registered trademark) F Dyes Yellow 083, Yellow 170, Orange 240, and Red 305 and quantum dots ($CsPbBr_xI_{3-x}$) that absorb the wavelength components of sunlight may be selected, for example. Note that, the fluorescent substances may be stuck on the upper surface 2a of the fluorescent light guide plate 2 in the form of a fluorescent substance layer 2d as shown in FIG. 1C. Alternatively, the fluorescent substances may be stuck on a lower surface (second surface) 2b of the fluorescent light guide plate 2 in the form of the fluorescent substance layer 2d as shown in FIG. 1D (in these cases, inside of fluorescent light guide plate 2 may be transparent).

The photoelectric cells 3 mounted on the upper surface 2a of the fluorescent light guide plate 2 may be any type of solar cell or photoelectric conversion element that absorbs the light components of sunlight to generate power. As described above, the wavelength band of the sunlight is wide. In addition, in the present embodiment, as will be described later, sunlight SL is concentrated by lens portions 4a and the photoelectric cells 3 are irradiated with the concentrated sunlight SL. Therefore, it is advantageous that a photoelectric cell that can absorb light over a wide range of wavelengths and that exhibits a high power generation efficiency even in a case of being irradiated with light having a relatively high intensity is used. Specifically, as the photoelectric cells 3, III-V multijunction solar cells may be selected. Note that, other types of photoelectric cells, such as CIS solar cells, crystalline silicon solar cells, amorphous silicon solar cells, and perovskite solar cells, may also be adopted as the photoelectric cells 3.

As will be described in detail later, the lens layer 4 overlapping the upper surface 2a of the fluorescent light guide plate 2 and the photoelectric cells 3 may have a layer structure including the lens portions 4a that are formed to concentrate sunlight onto the photoelectric cells 3 respectively and irradiate the photoelectric cells 3 with the concentrated sunlight and a connection portion 4b that connects the lens portions 4a to each other. The lens layer 4 may be formed of a transparent or light-transmitting material having a refractive index higher than that of air. Specifically, silicon resin (refractive index 1.43), low-refractive-index poly methyl methacrylate (refractive index 1.40), or soda glass (refractive index 1.51) may be adopted as the material thereof. Note that, as will be described later, it is preferable that a material having a refractive index lower than the refractive index of the fluorescent light guide plate 2 is selected as the material of the lens layer 4 so that light entering the fluorescent light guide plate 2 and fluorescent light emitted from the fluorescent light guide plate 2 are confined in the fluorescent light guide plate 2.

In addition, the lens portions 4a of the lens layer 4 are formed to concentrate light that reaches outer surfaces thereof (surfaces opposite to surfaces that face fluorescent light guide plate 2 or are close to fluorescent light guide plate 2 (upper surfaces in drawings)) onto the photoelectric cells 3. Regarding the shape of each lens portion 4a, the lens portions 4a may be spherical lenses. However, preferably, as described in Static concentrator photovoltaics for automotive applications (T. Masuda et. al., Solar Energy 146 (2017) 523-531), the lens portions 4a may be asymmetric-aspherical lenses that are adjusted to be able to concentrate light components that are incident on a lens surface at various angles of incidence onto the photoelectric cells 3 as much as possible, the light components including sunlight scattered in cloud or air or sunlight reflected or scattered at a building or the like in addition to direct light reaching the lens as parallel light from sunlight. More specifically, the lens portions 4a may be formed above light receiving surfaces of the photoelectric cells 3 (on side opposite to surfaces facing fluorescent light guide plate 2) such that a ratio (light concentration ratio) of the area of light reception of the lens portions 4a to the area of light reception of the photoelectric cells 3 is at least two, preferably four or more. The thickness of the lens layer may be, for example, 5 mm or less.

However, the present disclosure is not limited thereto. Note that, the smaller the area of the connection portion 4b in a top view (FIG. 1A) is, the larger the amount of sunlight that is concentrated by the lens portions 4a and with which the photoelectric cells 3 are irradiated is, which is advantageous. Specifically, it is preferable that an area occupied by the lens portions 4a in the entire light receiving surface of the lens layer 4 is maintained to be at least 70%. However, the present disclosure is not limited thereto. The sunlight is concentrated by the lens portions 4a and the photoelectric cells 3 are irradiated with the sunlight after light intensity is locally increased. Therefore, the photoelectric cells 3 may not be dispersed over a wide area below the lens layer 4 as long as the photoelectric cells 3 are disposed to be separated from each other at parts where the concentrated light reaches. Therefore, the number of the photoelectric cells 3 to be used per unit area irradiated with sunlight can be reduced.

Furthermore, in the device of the present embodiment, as described above, on the edge surfaces 2e of the fluorescent light guide plate 2, the photoelectric cell (second photoelectric cell) 5 that absorbs fluorescent light (and sunlight) emitted from the edge surfaces to generate power is disposed. As the photoelectric cell 5, any type of solar cell or photoelectric conversion element that mainly absorbs light components in a fluorescent light wavelength band may be adopted. For example, a CIS solar cell, a crystalline silicon solar cell, an amorphous silicon solar cell, or a perovskite solar cell may be selected as the photoelectric cell 5 (III-V multijunction solar cell which is more expensive than those described above may also be used). In FIG. 1A, the photoelectric cell 5 is disposed over all of the edge surfaces 2e of the fluorescent light guide plate 2. However, as will be described later (refer to FIG. 3C), the photoelectric cell 5 may be disposed at a portion of the edge surfaces 2e of the fluorescent light guide plate 2 (in this case, reflection mirror 9 or like is disposed at portion where no photoelectric cell 5 is disposed).

As will be described later, the above-described device of the present embodiment is expected to improve photoelectric conversion efficiency robustness with respect to the angle of incidence of sunlight and thus is expected to be able to be applied onto objects having various shapes, such as a roof of a moving object. Therefore, it is preferable that the device can be deformed to some extent in accordance with the shape of an object onto which the device is installed. Therefore, the fluorescent light guide plate and the lens layer may be formed of a flexible material so that the entire device can be curved.

Operation of Photoelectric Conversion Device

Figure 2A:
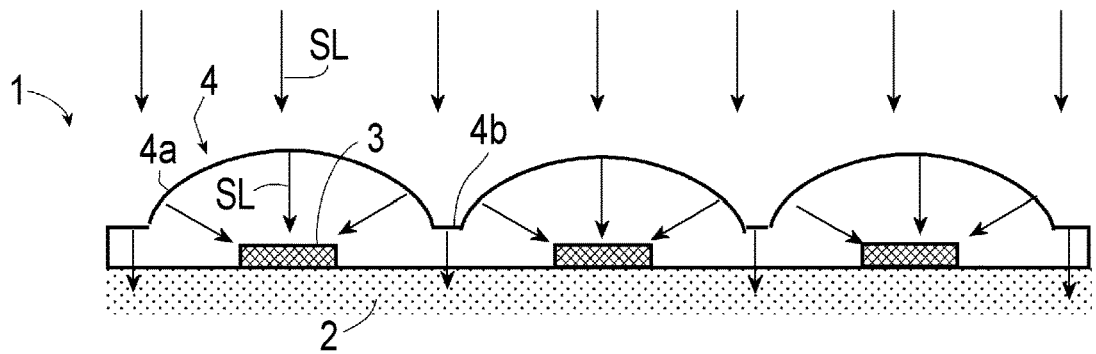
FIG. 2A is a view schematically showing the course of sunlight incident on the photoelectric conversion device according to the present embodiment and shows a state where the sunlight is incident in a direction perpendicular to a lens layer and light receiving surfaces of first photoelectric cells (angle of incidence=0°)

In the photoelectric conversion device of the present embodiment, in the case of irradiation with the sunlight SL from the lens layer 4 side, first, light incident onto the lens portions 4a is concentrated by the action of the lenses and is propagated toward the fluorescent light guide plate 2 on which the photoelectric cells 3 are disposed and the photoelectric cells 3 receives the light to generate power. Typically, as schematically illustrated in FIG. 2A, the shape of each lens portion 4a is formed such that a light ray (sunlight) SL incident onto the lens portion 4a along the optical axis (direction perpendicular to surface of central part of lens portion 4a) thereof (that is, light ray incident at angle of approximately 0°) is refracted toward a light receiving surface (upper surface in drawing) of the photoelectric cell 3. In addition, as an angle of incidence θ of light rays incident onto the lens portions 4a increase, the amount of light that passes through the lens portions 4a but misses the light receiving surfaces of the photoelectric cells 3 increases.

Figure 2B:
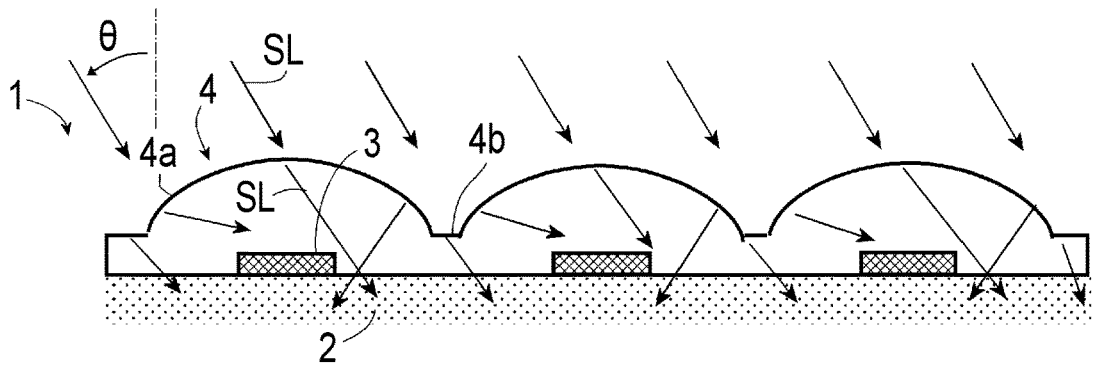
FIG. 2B is a view schematically showing the course of sunlight incident on the photoelectric conversion device according to the present embodiment and shows a state where the sunlight is incident in a direction inclined with respect to the lens layer and the light receiving surfaces of the first photoelectric cells (angle of incidence=θ)
Figure 5:
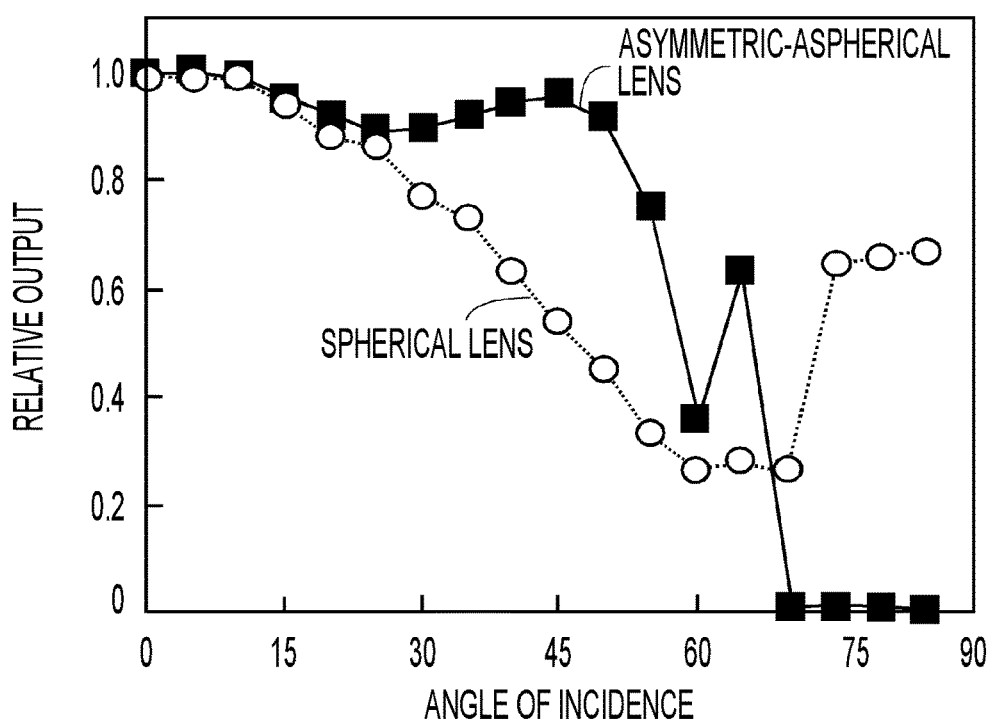
FIG. 5 shows the way in which power generation output of a photoelectric cell depends on the angle of incidence of sunlight in a case where sunlight is concentrated by a lens and the photoelectric cell is irradiated with the concentrated sunlight, which is calculated by a simulation and in the drawing, a case where a spherical lens is used and a case where an asymmetric-aspherical lens is used are shown in the drawing (quoted from Static concentrator photovoltaics for automotive applications (T. Masuda et. al., Solar Energy 146 (2017) 523-531)).

With regard to this, in a case where solar photovoltaic generation is performed with a power generation device, such as the photoelectric conversion device of the present embodiment, is placed under sunlight, the direction of incidence of sunlight changes depending on the orientation and altitude of the sun and as described in Static concentrator photovoltaics for automotive applications (T. Masuda et. al., Solar Energy 146 (2017) 523-531), the sunlight reaching the power generation device includes scattered light scattered by cloud, water or dust in air, a building, or the like at a high ratio in addition to direct light (parallel light) from the sun. Therefore, in order to utilize as much light from the sun as possible for power generation in the photoelectric conversion device, it is preferable that the range of angles of incidence of light, with which the photoelectric cells can be irradiated, is as wide as possible. According to a study described in Static concentrator photovoltaics for automotive applications (T. Masuda et. al., Solar Energy 146 (2017) 523-531), when an asymmetric-aspherical lens is used, a change in amount of irradiation of a photoelectric cell with respect to a change in angle of incidence of light incident onto the lens can be suppressed in comparison with a case where a spherical lens, which is normally used, is used. According to the above-described study, the result of a simulation indicates that, when the angle of incidence of light with which a spherical lens and an asymmetric-aspherical lens are irradiated is changed with photoelectric cells respectively disposed below the lenses as shown in FIGS. 2A and 2B, the output of the photoelectric cell gradually decreases as the angle of incidence increases in the case of the spherical lens and in the case of the asymmetric-aspherical lens, the output of the photoelectric cell is approximately maintained until the angle of incidence reaches a certain degree (approximately 60° in illustrated example) even when the angle of incidence increases, as shown in FIG. 5. Therefore, when the asymmetric-aspherical lens is used as a lens for light concentration in the photoelectric conversion device, it is possible to use light over a relatively wide range of angles for power generation of the photoelectric cells.

However, as can be understood from FIG. 5, in a case where a spherical lens is used as a condenser lens, the amount of light components that miss the photoelectric cell increases as the angle of incidence increases and even in the case of the asymmetric-aspherical lens, a light component of which the angle of incidence exceeds the certain degree misses the photoelectric cell and the light component missing the photoelectric cell cannot be used for power generation as it is. Further, as can be understood from FIGS. 2A and 2B, in a case where the connection portions 4b are present between the lens portions 4a adjacent to each other in the lens layer 4, light incident onto the connection portions 4b also does not hit the photoelectric cells 3 and is not used for power generation. Therefore, in the device of the present embodiment, the fluorescent light guide plate 2 carrying a fluorescent substance is used as a substrate on which the photoelectric cells 3 are mounted in order that light components missing the photoelectric cells can also be used for power generation and light with which the photoelectric cells 3 are not irradiated is concentrated by being converted into fluorescent light and can be used for power generation. Therefore, the power generation efficiency of the photoelectric conversion device can be improved.

Figure 2C:
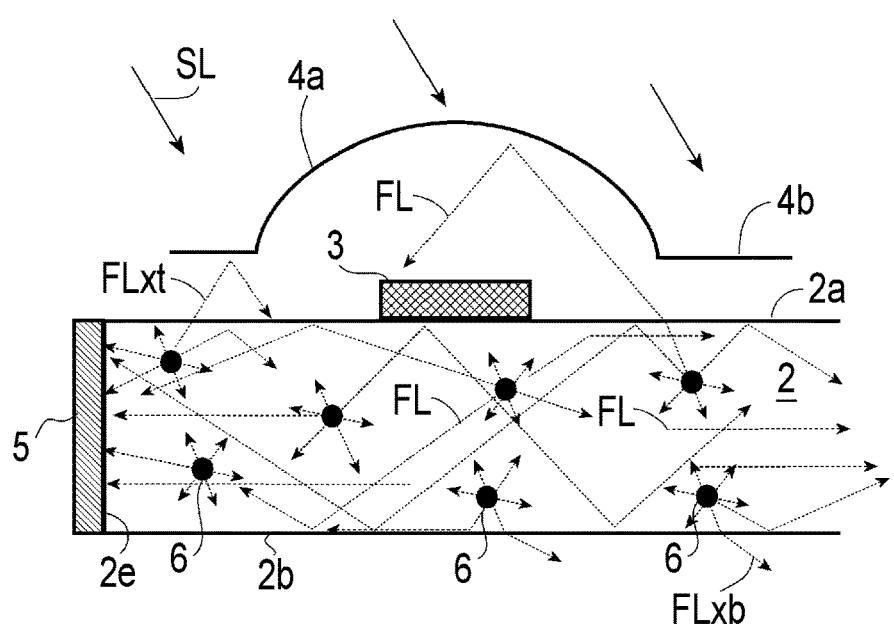
FIG. 2C is a view schematically showing the course of fluorescent light emitted from the fluorescent substances in the fluorescent light guide plate of the photoelectric conversion device according to the present embodiment.

Specifically, as schematically illustrated in FIG. 2C, fluorescent substances 6 are dispersed inside the fluorescent light guide plate 2, on the upper surface of the fluorescent light guide plate 2, or on the lower surface of the fluorescent light guide plate 2 as described above and the fluorescent substances 6 are excited by the sunlight SL entering the fluorescent light guide plate 2 after missing the photoelectric cells 3 and emits fluorescent light FL. The fluorescent light FL from the fluorescent substances 6 is emitted from the fluorescent substances 6 in radial directions. In a case where the refractive index of the fluorescent light guide plate 2 is higher than the outside thereof, a part of the fluorescent light FL (FLxt, FLxb) is transmitted through the surfaces 2a, 2b of the fluorescent light guide plate 2 but a majority of components of the fluorescent light FL are confined inside the fluorescent light guide plate 2 due to reflection or total reflection, propagated to the edge surfaces 2e, and emitted by being concentrated to the edge surfaces 2e. Therefore, the photoelectric cell 5 is disposed on the edge surfaces 2e, and the photoelectric cell 5 is configured to absorb fluorescent light emitted from the edge surfaces 2e to generate power. A portion of sunlight entering the fluorescent light guide plate 2 may be concentrated to the edge surfaces 2e and absorbed by the photoelectric cell 5 to be converted into power as it is without being converted into fluorescent light.

Therefore, in the case of the photoelectric conversion device of the present embodiment described above, when the photoelectric conversion device is disposed under the sunlight SL, first, the photoelectric cells 3 are irradiated with light concentrated at the lens portions 4a of the lens layer 4 and the light is converted into power at the photoelectric cells 3 and extracted to the outside through the power line 10a. Then, light components after incidence onto the lens layer 4 with which the photoelectric cells 3 are not irradiated are incident onto the fluorescent light guide plate 2 and converted into the fluorescent light FL by the fluorescent substances 6 at the fluorescent light guide plate 2. The fluorescent light FL is concentrated to the edge surfaces 2e of the fluorescent light guide plate 2, the photoelectric cell 5 is irradiated with the fluorescent light FL, and the fluorescent light FL is converted into power at the photoelectric cell 5 and extracted to the outside through the power line 10b.

As described above, in the case of a configuration in which the fluorescent light guide plate 2 is used as the substrate of the photoelectric cells 3 and sunlight that does not hit the photoelectric cells 3 is converted into fluorescent light at the fluorescent light guide plate 2, is concentrated to the edge surfaces 2e of the fluorescent light guide plate 2, and is converted into power by the photoelectric cell 5 at the edge surfaces 2e, even when a portion of light rays concentrated by the lens layer 4 miss the photoelectric cells 3, the energy thereof can be extracted as power at the photoelectric cell 5 via the fluorescent light guide plate 2. Therefore, it can be said that the device in the present embodiment improves robustness with respect to the angle of incidence of sunlight incident onto the lens layer 4. Furthermore, in a case where the connection portion 4b is present between the lens portions 4a of the lens layer 4 that are adjacent to each other, the energy of sunlight entering the connection portion 4b is also converted into power and thus energy conversion efficiency is further improved. Therefore, with the device of the present embodiment, it is possible to extract, as power, sunlight components that reach the ground in the form of scattered light in addition to sunlight components that reach the ground in the form of direct light. In addition, it is expected that higher energy conversion efficiency can be achieved than the related art even in a case where a sun-tracking mechanism that causes the orientation of a lens to follow a change in position of the sun is not provided and since the robustness with respect to the angle of incidence of sunlight is improved, it is possible to reduce a sun-tracking precision requirement even in a case where the sun-tracking mechanism is used, which is advantageous.

Further Improvement of Configuration of Photoelectric Conversion Device Improvement of Light Confinement Action in Fluorescent Light Guide Plate 2

As schematically illustrated in FIG. 2C, a part (FLxt, FLxb) of the components of the fluorescent light FL emitted from the fluorescent substances 6 in the fluorescent light guide plate 2, of which the angle of incidence with respect to the surfaces 2a, 2b of the fluorescent light guide plate 2 is lower than the critical angle, is transmitted through the surfaces 2a, 2b as described above. Since the refractive index of the outside (generally, air) of the lens layer 4 is low, when the fluorescent light FLxt, which is a part of the fluorescent light FL, is incident onto an outer surface of the lens layer 4, most of the fluorescent light FLxt emitted from the surface 2a that faces the lens layer 4 is reflected and thus is expected to be incident onto the photoelectric cells 3 or incident onto the fluorescent light guide plate 2 again. However, a majority of fluorescent light components transmitted through the surfaces 2a, 2b is not incident onto the fluorescent light guide plate 2 again and not absorbed by the photoelectric cell 5. Therefore, in order to improve the effect of confining the fluorescent light FL in the fluorescent light guide plate 2, the following improved configuration may be applied to the fluorescent light guide plate 2.

Figure 3A:
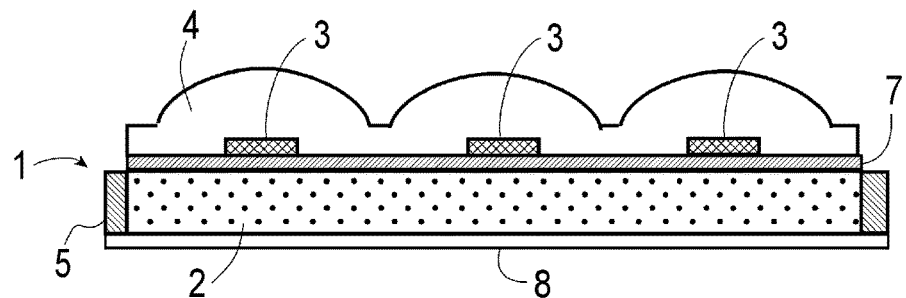
FIG. 3A is a view schematically showing an example of various configurations for confinement of fluorescent light in the fluorescent light guide plate of the photoelectric conversion device according to the present embodiment and shows an example in which an adhesive layer is interposed between the lens layer and the fluorescent light guide plate and a reflection mirror is stuck on the lower surface (second surface) of the fluorescent light guide plate.

First, with reference to FIG. 3A, a reflection mirror 8 that reflects light may be provided at the lower surface 2b of the fluorescent light guide plate 2 so that fluorescent light (or sunlight) is prevented from being emitted from the lower surface 2b of the fluorescent light guide plate 2. As the reflection mirror, for example, an aluminum film (refractive index 1.48), a silver film (refractive index 0.17), or a duralumin film (refractive index 1.48) may be adopted. Preferably, a material having a refractive index lower than the refractive index of the fluorescent light guide plate 2 may be selected as the material of the reflection mirror 8 in order to reduce transmission of light through an interface between the fluorescent light guide plate 2 and the reflection mirror 8 as much as possible.

Figure 3B:
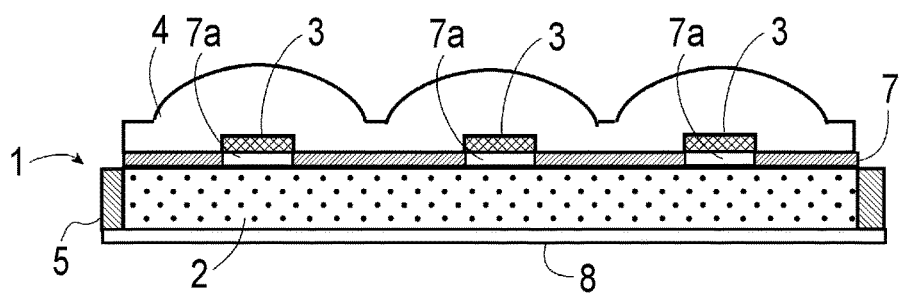
FIG. 3B is a view schematically showing an example of various configurations for confinement of fluorescent light in the fluorescent light guide plate of the photoelectric conversion device according to the present embodiment and shows an example in which an adhesive layer different from the adhesive layer between the lens layer and the fluorescent light guide plate is interposed between the first photoelectric cells and the fluorescent light guide plate and the reflection mirror is stuck on the lower surface (second surface) of the fluorescent light guide plate.

In addition, preferably, a material having a refractive index lower than the refractive index of the fluorescent light guide plate 2 may be selected as the material of the lens layer 4 in order to prevent fluorescent light (or sunlight) from being emitted from the upper surface 2a of the fluorescent light guide plate 2. Furthermore, in a case where an adhesive layer 7 is applied when the lens layer 4 is bonded to the fluorescent light guide plate 2, a material having a refractive index lower than the refractive index of the fluorescent light guide plate 2 and higher than the refractive index of the lens layer 4 may be selected as the material of the adhesive layer 7. As a result, light entering the lens layer 4 is easily transmitted to the fluorescent light guide plate 2 through the adhesive layer 7 and it is difficult for light in the fluorescent light guide plate 2 to be transmitted to the adhesive layer 7. Therefore, the effect of confining light in the fluorescent light guide plate 2 is improved. As the material of the adhesive layer 7, low-refractive-index epoxy (refractive index 1.50), cyanoacrylate (refractive index 1.43), acrylic adhesive (refractive index 1.49), or the like may be used. Note that, with reference to FIG. 3B, since light from the lens layer 4 does not reach an interface between the photoelectric cell 3 and the fluorescent light guide plate 2, a layer having a refractive index lower than the refractive index of the lens layer 4 may be formed in a case where an adhesive layer 7a is applied between the photoelectric cells 3 and the fluorescent light guide plate 2. As a result, it is possible to make it more difficult for light to be transmitted from the fluorescent light guide plate 2 to the adhesive layer 7a and thus the effect of confining light in the fluorescent light guide plate 2 is further improved.

Figure 3C:
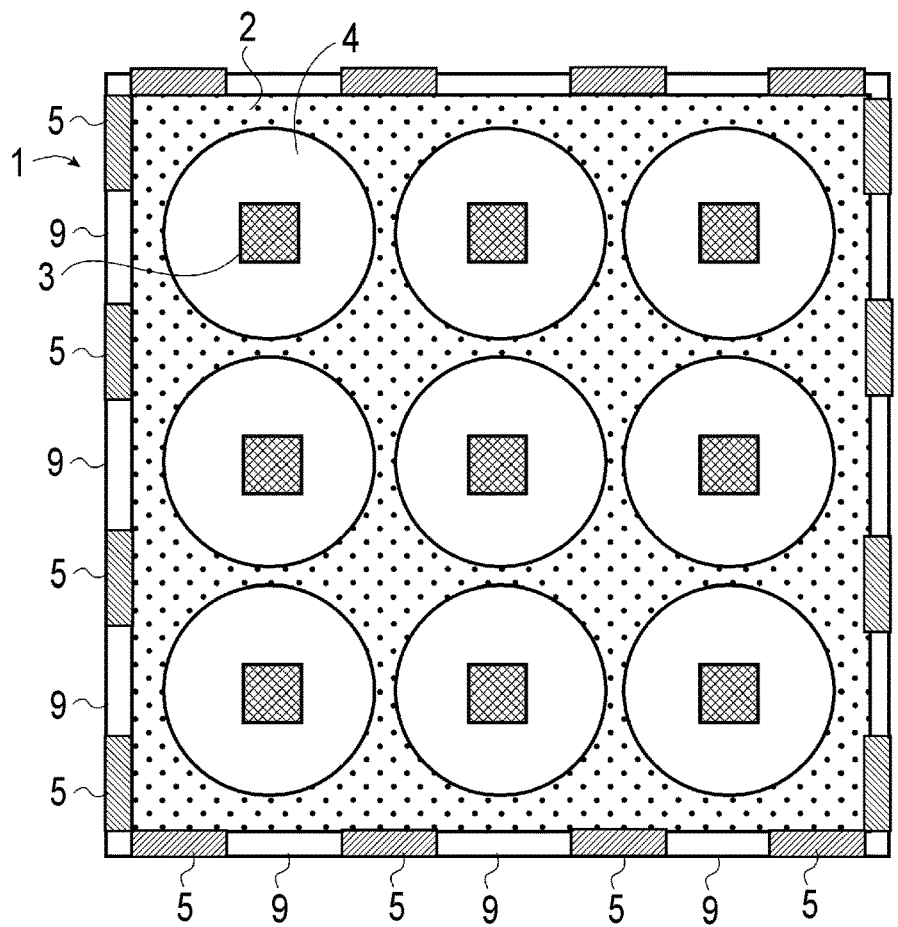
FIG. 3C is a view schematically showing an example of various configurations for confinement of fluorescent light in the fluorescent light guide plate of the photoelectric conversion device according to the present embodiment and shows an example in which a second photoelectric cell is disposed at a portion of the edge surface of the fluorescent light guide plate and a reflection mirror is stuck on the other portion.

Furthermore, as illustrated in FIG. 3C, in a case where no photoelectric cell 5 is installed over the entire edge surfaces 2e of the fluorescent light guide plate 2, a reflection mirror 9 similar to the reflection mirror 8 may be disposed to prevent light from being emitted from a portion where no photoelectric cell 5 is installed. In this case, it is possible to reduce light that is emitted without being used for power generation at the edge surfaces of the fluorescent light guide plate 2.

Reduction of Amount of Fluorescent Light Reabsorption of Fluorescent Substances

Figure 4:
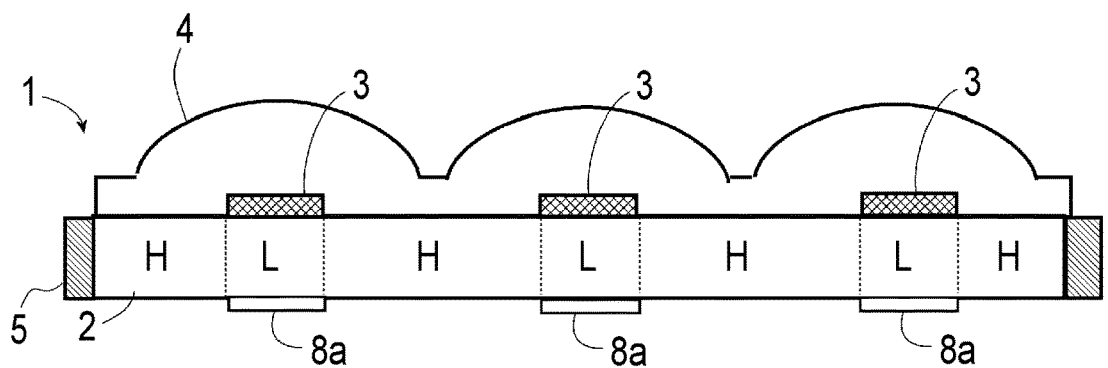
FIG. 4 is a view schematically showing an example in which the distribution of fluorescent substances in a portion where sunlight is less likely to reach is reduced in the fluorescent light guide plate of the photoelectric conversion device according to the present embodiment.

Regarding the fluorescent substances 6 dispersed in the fluorescent light guide plate 2, generally, the fluorescent light wavelength and the absorption wavelength overlap with each other at least partially and in this case, fluorescent light emitted from the fluorescent substance 6 that has absorbed sunlight absorbed again by another fluorescent substance in some cases and energy loss due to the re-absorption occurs (energy of light converted into power is reduced). With regard to this, the fluorescent substance 6 needs to be provided at a portion in the fluorescent light guide plate 2 where the sunlight can reach and even in a case where the fluorescent substance 6 is present at a portion where the sunlight does not reach, the fluorescent substance 6 does not absorb the sunlight and merely absorbs fluorescent light emitted from other fluorescent substances 6, which is wasteful. Therefore, in the fluorescent light guide plate 2, the density or the amount of dispersal of the fluorescent substances in a portion where the sunlight does not reach may be lower than that in a portion where the sunlight can reach. For example, as schematically illustrated in FIG. 4, since the sunlight is less likely to reach regions below portions of the fluorescent light guide plate 2 on which the photoelectric cells 3 are disposed, a density L of the fluorescent substances in the above-described regions may be lower than a density H at other regions. Accordingly, the amount of re-absorption of fluorescent light performed by fluorescent substances that do not absorb sunlight is reduced and thus energy loss can be suppressed. Note that, since the sunlight is easily transmitted through the regions L where the density of the fluorescent substances is low, reflection mirrors 8a may be locally disposed such that leakage of light from the surface 2b is suppressed as schematically illustrated in FIG. 4.

Although the above description has been made in relation to the embodiment of the present disclosure, it is obvious to those skilled in the art that a lot of corrections and modifications can be easily made and the present disclosure is not limited to the embodiment described above and can be applied to various devices without departing from the concept of the present disclosure.

What is claimed is:

1. A photoelectric conversion device comprising:
    a fluorescent light guide plate that includes a first surface, a second surface, and an edge surface that connects peripheral edges of the first surface and the second surface to each other and has a plate-shaped structure in which fluorescent substances that absorb at least a portion of components of sunlight and emit fluorescent light are dispersed in the fluorescent light guide plate or on the first surface or the second surface and which is formed of a material having a refractive index different from a refractive index of an outside, the fluorescent light guide plate being configured such that the fluorescent light emitted from the fluorescent substances are concentrated onto the edge surface to be emitted when the sunlight is incident from the first surface;
    a first photoelectric cell configured to generate power by being irradiated with the sunlight, the first photoelectric cell being mounted on the first surface of the fluorescent light guide plate;
    a lens layer configured such that light incident from an outer surface that is on a side opposite to a surface facing the first surface of the fluorescent light guide plate is concentrated onto the first photoelectric cell, the lens layer overlapping the first surface of the fluorescent light guide plate and the first photoelectric cell;
    a second photoelectric cell configured to generate power by being irradiated with the fluorescent light emitted from the edge surface, the second photoelectric cell being mounted on the edge surface of the fluorescent light guide plate; and
    power output units configured to extract power obtained in each of the first photoelectric cell and the second photoelectric cell.

2. The device according to claim 1, wherein a plurality of the first photoelectric cells is disposed to be separated from each other on the first surface of the fluorescent light guide plate.

3. The device according to claim 1, wherein the lens layer is configured such that a light receiving surface of the first photoelectric cell is irradiated with light concentrated by the lens layer when an angle of incidence of light incident onto the outer surface of the lens layer is lower than a predetermined angle.

4. The device according to claim 1, wherein a refractive index of the fluorescent light guide plate is higher than a refractive index of the lens layer.

5. The device according to claim 1, wherein:
    the fluorescent light guide plate and the lens layer are bonded to each other via a first adhesive layer; and
    a refractive index of the first adhesive layer is lower than a refractive index of the fluorescent light guide plate and is higher than a refractive index of the lens layer.

6. The device according to claim 5, wherein a refractive index of a second adhesive layer bonding the fluorescent light guide plate and the first photoelectric cell to each other is lower than the refractive index of the first adhesive layer.

7. The device according to claim 1, wherein the second surface of the fluorescent light guide plate is covered with a reflection mirror layer that reflects light without allowing the light to be transmitted through the reflection mirror layer.

8. The device according to claim 1, wherein a portion of the edge surface of the fluorescent light guide plate where the second photoelectric cell is not mounted is covered with a reflection mirror layer that reflects light without allowing the light to be transmitted through the reflection mirror layer.

9. The device according to claim 1, wherein in the fluorescent light guide plate, a density of the fluorescent substances in a region where light incident from the first surface does not reach is lower than a density of the fluorescent substances in a region where the light incident from the first surface reaches.

10. The device according to claim 1, wherein the fluorescent light guide plate and the lens layer are formed of a flexible material.

* * * * *